(12) United States Patent
Raynor et al.

(10) Patent No.: US 12,224,302 B2
(45) Date of Patent: Feb. 11, 2025

(54) IMAGE SENSOR PIXELS HAVING REDUCED PITCH

(71) Applicants: STMICROELECTRONICS (RESEARCH & DEVELOPMENT) LIMITED, Marlow (GB); STMicroelectronics (Crolles 2) SAS, Crolles (FR)

(72) Inventors: Jeff M. Raynor, Edinburgh (GB); Frederic Lalanne, Bernin (FR); Pierre Malinge, Bernin (FR)

(73) Assignees: STMICROELECTRONICS (RESEARCH & DEVELOPMENT) LIMITED, Marlow (GB); STMicroelectronics (Crolles 2) SAS, Crolles (FR)

( * ) Notice: Subject to any disclaimer, the term of this patent is extended or adjusted under 35 U.S.C. 154(b) by 830 days.

(21) Appl. No.: 16/862,316

(22) Filed: Apr. 29, 2020

(65) Prior Publication Data
US 2020/0350355 A1 Nov. 5, 2020

(30) Foreign Application Priority Data

Apr. 30, 2019 (FR) ...................................... 1904587

(51) Int. Cl.
*H01L 27/146* (2006.01)
*H04N 25/77* (2023.01)
*H04N 25/53* (2023.01)

(52) U.S. Cl.
CPC .... *H01L 27/14641* (2013.01); *H01L 27/1463* (2013.01); *H01L 27/14643* (2013.01); *H04N 25/77* (2023.01); *H04N 25/53* (2023.01)

(58) Field of Classification Search
CPC .......... H01L 27/14641; H01L 27/1463; H01L 27/14643; H01L 27/14603; H01L 27/14612; H04N 25/77; H04N 25/53; H04N 25/771
See application file for complete search history.

(56) References Cited

U.S. PATENT DOCUMENTS

| 9,813,631 | B2 | 11/2017 | Raynor |  |
|---|---|---|---|---|
| 10,021,334 | B2 | 7/2018 | Stark |  |
| 2011/0180689 | A1 | 7/2011 | Roy et al. |  |
| 2012/0033119 | A1* | 2/2012 | Shinohara | ........... H01L 27/1464 257/E31.119 |
| 2015/0214260 | A1* | 7/2015 | Inui | ................... H01L 27/14603 257/222 |
| 2016/0056188 | A1* | 2/2016 | Lee | ................... H01L 27/14643 257/446 |
| 2016/0056199 | A1* | 2/2016 | Kim | ..................... H04N 25/771 257/233 |
| 2016/0056200 | A1* | 2/2016 | Lee | ..................... H01L 27/1464 257/292 |
| 2018/0114806 | A1 | 4/2018 | Kim |  |
| 2018/0166477 | A1 | 6/2018 | Raynor |  |
| 2018/0182794 | A1* | 6/2018 | Go | ................... H01L 27/14636 |

(Continued)

FOREIGN PATENT DOCUMENTS

WO 2018/139154 A1 8/2018

*Primary Examiner* — Nilufa Rahim
(74) *Attorney, Agent, or Firm* — Seed IP Law Group LLP

(57) ABSTRACT

The present disclosure relates to an image sensor that includes first and second pixels. One or more transistors of the first pixel share an active region with one or more transistors of the second pixel.

20 Claims, 13 Drawing Sheets

(56) References Cited

U.S. PATENT DOCUMENTS

2018/0182804 A1* 6/2018 Lee .................. H01L 27/14603
2019/0288023 A1 9/2019 Raynor
2019/0341411 A1* 11/2019 Lim ...................... H04N 25/59
2020/0075644 A1* 3/2020 Aoki ................... H01L 27/1463
2020/0075660 A1* 3/2020 Koyama ........... H01L 27/14603

* cited by examiner

IMAGE SENSOR PIXELS HAVING REDUCED PITCH

BACKGROUND

Technical Field

The present disclosure relates generally to the field of image sensors, and more specifically to pixels of image sensors.

Description of the Related Art

In the field of CMOS image sensors, the pixels may be designed as rolling blade pixels or global shutter pixels.

Rolling blade pixels are read, usually row by row, directly after an integration period of each of the pixels, and thus there is no local storage of the captured pixel value within each pixel.

Global shutter pixels have more transistors than rolling blade pixels, and provide some local storage for storing the captured pixel value within each pixel until it can be read. The pixel pitch of global shutter pixels is larger than that of rolling blade pixels, generally by a factor of at least four.

There is a continuing desire in the art to reduce the pixel pitch of both rolling blade pixels and global shutter pixels, permitting smaller image sensors and/or image sensors with an increased number of pixels to be manufactured.

BRIEF SUMMARY

According to one aspect, there is provided an image sensor comprising first and second pixels, wherein one or more transistors of the first pixel share an active region with one or more transistors of the second pixel.

According to one embodiment, the active region is a strip of semiconductor material surrounded by a first isolation trench.

According to one embodiment, the first pixel comprises a first photodiode and the second pixel comprises a second photodiode.

According to one embodiment, the first and second photodiodes are at least partially separated from each other by a second isolation trench.

According to one embodiment, the image sensor further comprises a third isolation trench extending between the first photodiode and the active region and a fourth isolation trench extending between the second photodiode and the active region.

According to one embodiment, the second isolation trench has a greater depth than the first isolation trench.

According to one embodiment, the one or more transistors of the first pixel comprise a source follower transistor having a control node coupled to the first photodiode and the one or more transistors of the second pixel comprise a source follower transistor having a control node coupled to the second photodiode.

According to one embodiment, a first of the one or more transistors of the first pixel shares a common source or drain with a first of the one or more transistors of the second pixel, the common source or drain being connected to a column line of the image sensor.

According to one embodiment, the first transistor of the first pixel is coupled between the source of a second transistor of the first pixel and the column line, and the first transistor of the second pixel is coupled between the source of a second transistor of the second pixel and the column line.

According to one embodiment, the first and second transistors of the first pixel form part of a first readout path of the first pixel, the first pixel comprising two readout paths, and the first and second transistors of the second pixel form part of a second readout path of the second pixel, the second pixel comprising two readout paths.

According to one embodiment, the one or more transistors of the first pixel and the one or more transistors of the second pixel are n-channel MOS transistors, and the active region is of type p with regions of type n forming sources and drains of the one or more transistors of the first pixel and the one or more transistors of the second pixel.

According to a further aspect, there is provided a method of fabricating an image sensor comprising: forming an active region; and forming one or more transistors of a first pixel of the image sensor, and one or more transistors of a second pixel of the image sensor, in the active region.

BRIEF DESCRIPTION OF THE SEVERAL VIEWS OF THE DRAWINGS

The foregoing features and advantages, as well as others, will be described in detail in the following description of specific embodiments given by way of illustration and not limitation with reference to the accompanying drawings, in which.

DETAILED DESCRIPTION

Like features have been designated by like references in the various figures. In particular, the structural and/or functional features that are common among the various embodiments may have the same references and may dispose identical structural, dimensional and material properties.

The various layouts represented in the figures include contacts for making electrical connections between regions of the pixels and voltage rails or other contacts. It will be apparent to those skilled in the art that, while not represented in the figures, these connections are for example implemented via one or more overlying metal layers.

Unless indicated otherwise, when reference is made to two elements connected together, this signifies a direct connection without any intermediate elements other than conductors, and when reference is made to two elements linked or coupled together, this signifies that these two elements can be connected or they can be linked or coupled via one or more other elements.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

Figure 1:
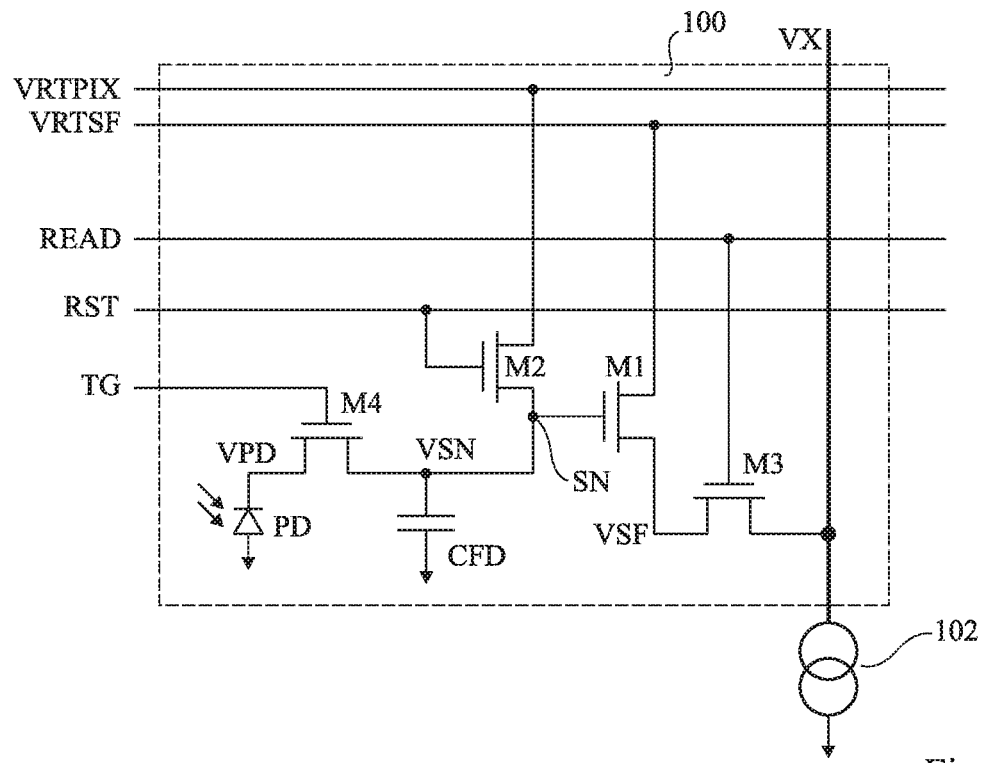
FIG. 1 schematically illustrates a 4T rolling blade pixel according to an example embodiment.

FIG. 1 schematically illustrates a 4T rolling blade pixel 100 according to an example embodiment. The pixel 100 is for example part of an array of pixels formed in rows and columns, there for example being hundreds or even thousands of pixels in each row and in each column.

The pixel 100 comprises a photodiode PD, which is for example a buried, fully depleted, photodiode, having its anode coupled to a ground rail. The cathode of the photodiode PD provides a photodiode voltage VPD, and is for example coupled to a sense node SN via a transfer gate represented by a transistor M4 in FIG. 1. The gate of the transistor M4 is controlled by a signal TG. The sense node SN, also sometimes referred to as a floating diffusion node, provides charge storage inside the pixel 100 on a capacitor CFD, and stores a voltage VSN. The sense node SN is coupled via a transistor M2 to a pixel reset voltage rail VRTPIX. The transistor M2 for example has its gate coupled to a rail RST. The sense node SN is also for example coupled to the gate of a further transistor M1, which is arranged in a source-follower configuration. In particular, the transistor M1 has its drain coupled to a further supply voltage rail VRTSF, and its source coupled to a pixel column line VX, via a further transistor M3. The control node of the transistor M3 is coupled to a READ rail.

The rails VRTPIX, VRTSF, READ, RST and TG, as well as the ground rail (not illustrated) are for example common to a row of pixels in the pixel array. The pixel column line VX is for example common to a column of pixels in the pixel array. The pixel column line VX is for example coupled to ground at the bottom of each column of pixels via a current source 102.

The pixel 100 is known as a 4T pixel because it includes 4 transistors M1 to M4 for a single photodiode PD.

Figure 2:
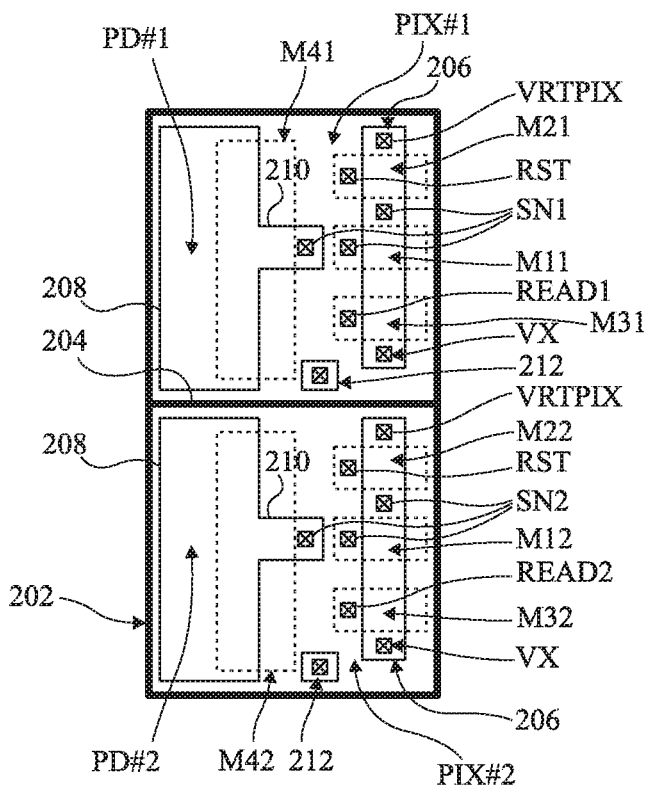
FIG. 2 is a plan view illustrating a layout of two adjacent 4T pixels each corresponding to the pixel of FIG. 1 according to an example embodiment.

FIG. 2 is a plan view illustrating an example of the layout of two adjacent 4T pixels PIX #1, PIX #2, each corresponding to the pixel 100 of FIG. 1.

In the example of FIG. 2, each pixel PIX #1, PIX #2 is surrounded by a continuous isolation trench 202, for example corresponding to a DTI (deep trench isolation) or a CDTI (capacitive DTI). The trench 202 surrounding each pixel is rectangular in the example of FIG. 2, and includes a portion 204 common to the two adjacent pixels and separating them from each other.

The transistors M1, M2 and M3 are all for example n-channel MOS transistors. In FIG. 2, the references of these transistors have the suffix "1" in the pixel PIX #1, e.g., M11, M21, M31, and the suffix "2" in the pixel PIX #2, e.g., M12. M22. M32. Each pixel PIX #1, PIX #2 for example includes a continuous active region 206 in which these transistors M1, M2 and M3 are formed, and an active region 208 forming the photodiodes PD #1, PD #2 of the pixels.

The photodiodes PD #1, PD #2 are positioned on the left-hand side of each pixel in the example of FIG. 2. The active regions 208 are substantially rectangular, with a protrusion 210 on their right-hand side in which a contact to the corresponding sense node SN is formed, which is labelled SN1 in the pixel PIX #1 and SN2 in the pixel SN #2.

The transfer gate M41 of the pixel PIX #1, and M42 of the pixel PIX #2, are represented by dashed rectangles. Each transfer gate M41, M42 partially overlaps the active region 208, including a part of the protrusion 210 of each photodiode PD #1, PD #2, excluding the corresponding contact SN1, SN2. While not illustrated in FIG. 2, a gate contact is for example formed close to the center of each transfer gate M41, M42.

The active region 206 of each pixel PIX #1, PIX #2 is formed on the right-hand side of the pixel in the example of FIG. 2. The active region 206 for example corresponds to a continuous strip of semiconductor material, for example of silicon, this strip for example being surrounded by a shallow trench isolation (STI).

The terms "deep trench isolation", "DTI" or "CDTI", and the terms "shallow trench isolation", or "STI", are used herein to designate relative depths of the isolation trenches, the deep trench isolations for example having a greater depth than the shallow trench isolations. In some examples, the deep trench isolations are at least 20 percent deeper than the shallow trench isolations. In other embodiments, the deep trench isolations are of the full depth of the substrate, whereas the shallow trench isolations descend only partially through the substrate.

The transistors M11, M21 and M31 are formed within and on the active region 206 of the pixel PIX #1, and similarly, the transistors M12, M22 and M32 are formed within and on the active region 206 of the pixel PIX #2.

A bulk connection 212 is for example provided in each pixel, allowing a voltage to be applied to a substrate of the pixel (not illustrated in FIG. 2). In one example, the transistors of each pixel are n-channel MOS transistors, and the substrate is of p-type.

The active region 206 comprises, in the pixel PIX #1, and from top to bottom in the example of FIG. 2: a contact for the rail VRTPIX; the transistor M21, having a gate represented by a dashed rectangle crossing the active region 206 and including a gate contact coupled to the rail RST; a contact coupled to the sense node SN1; the transistor M11 having a gate represented by a dashed rectangle crossing the active region 206 and including a gate contact coupled to the sense node SN1; the transistor M31 having a gate represented by dashed rectangle crossing the active region 206 and including a gate contact coupled to the read rail READ to receive a corresponding read signal READ1; and a contact coupled to the column line VX.

Similarly, the active region 206 comprises, in the pixel PIX #2, and from top to bottom in the example of FIG. 2: a contact for the rail VRTPIX; the transistor M22, having a gate represented by a dashed rectangle crossing the active region 206 and including a gate contact coupled to the rail RST; a contact coupled to the sense node SN2; the transistor M12 having a gate represented by a dashed rectangle crossing the active region 206 and including a gate contact coupled to the sense node SN2; the transistor M32 having a gate represented by dashed rectangle crossing the active region 206 and including a gate contact coupled to the read rail READ to receive a corresponding read signal READ2; and a contact coupled to the column line VX.

The pixel layouts of FIG. 2 lead to a relatively compact pixel array, but it would be desirable to further reduce the footprint of each pixel in order to provide smaller image sensors and/or image sensors with an increased number of pixels.

Figure 3:
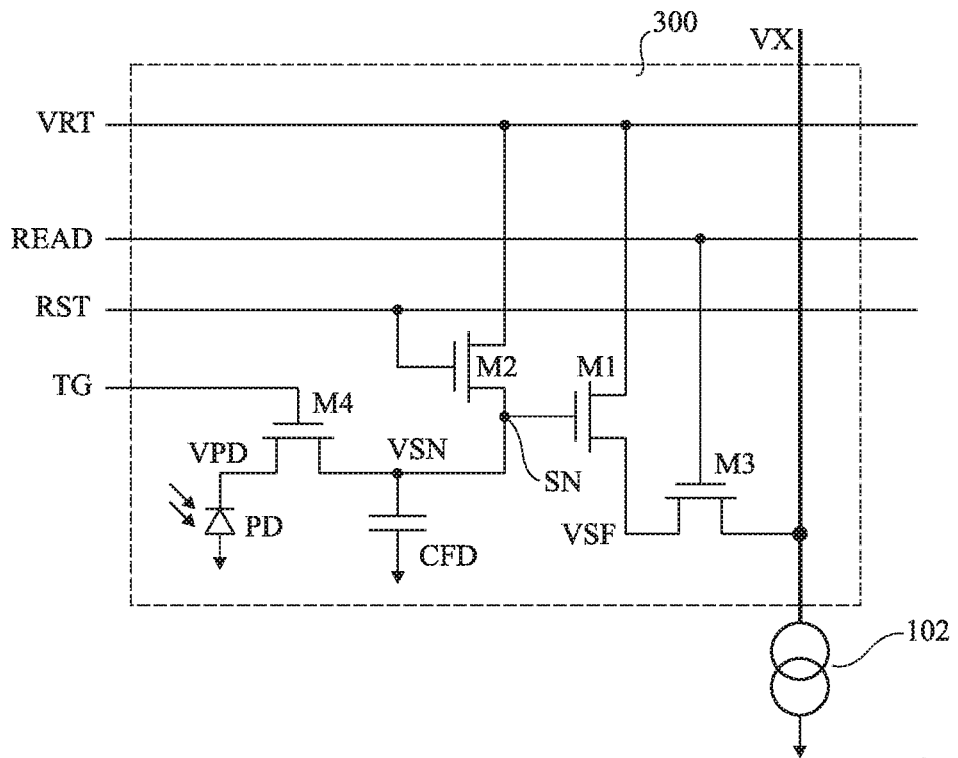
FIG. 3 schematically illustrates a 4T rolling blade pixel according to an example embodiment.

FIG. 3 schematically illustrates a 4T rolling blade pixel 300 according to a further example embodiment. The pixel 300 is the same as the pixel 100 of FIG. 1, except that the rail VRTSF is removed, and drain of the transistor M1 is instead coupled to the rail VRT. This implies that a same supply voltage level is used for the reset and read operations.

Figure 4:
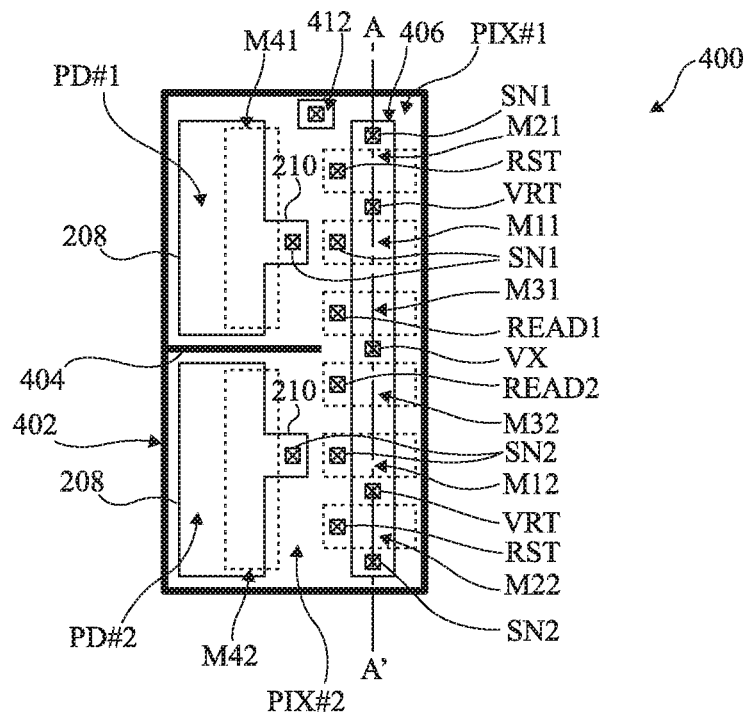
FIG. 4 is a plan view illustrating a layout of two adjacent 4T pixels each corresponding to the pixel of FIG. 3 according to an example embodiment of the present disclosure.

FIG. 4 is a plan view illustrating a layout of two adjacent 4T pixels PIX #1, PIX #2 each corresponding to the pixel 300 of FIG. 3 according to an example embodiment of the present disclosure. The pixels PIX #1, PIX #2 are for example pixels sharing a same column of a pixel array. The pixel array for example comprises at least some pixels formed according to the layout of FIG. 4, and is preferably formed only of pixels formed according to this layout, which is for example possible when there is an even number of rows in the array.

In the embodiment of FIG. 4, the pair of pixels is surrounded by a continuous isolation trench 402, which, like the trench 202 of FIG. 2, is for example a DTI or CDTI. However, rather than comprising a portion 204 completely separating the pixels, the trench 402 includes a portion 404 between the pixels and only partially separating the pixels, the portion 404 including an opening allowing a common active region 406 to extend between the two pixels.

Like the pixels PIX #1, PIX #2 of FIG. 2, the pixels of FIG. 4 comprise active regions 208 forming the photodiodes PD #1, PD #2 of the pixels, including protrusions 210, which will not be described again in detail.

The common active region 406 is for example formed on the right-hand side of the pixels PIX #1, PIX #2. In the example of FIG. 4, this active region 406 is shared by the transistors M11, M21, M31, M12, M22 and M32 of the adjacent pixels PIX #1, PIX #2.

The pixels PIX #1 and PIX #2 are for example in a same column, and are thus both coupled to a common pixel column line VX. In the example of FIG. 4, a single VX contact is for example positioned at a boundary between the two pixels PIX #1, PIX #2, at substantially the center of the active region 406, and is shared by the two pixels PIX #1, PIX #2.

The active region 406 corresponds to a continuous strip of semiconductor material, such as silicon. In the case that the transistors of each pixel are NMOS transistors, the active region 406 is for example a portion of a p-type substrate around which a shallow trench isolation has been formed (not illustrated in FIG. 4). Transistors and contacts are formed in a linear manner along the length of this active region 406, with common source/drain regions for example being provided between each adjacent pair of the transistors, as will now be described in more detail.

In the pixel PIX #1, the transistor M31 is for example adjacent to the VX contact such that its source is coupled to the VX column line. The gate of the transistor M31, represented by a dashed rectangle, is coupled by a contact to the READ rail in order to receive the signal READ1. The transistor M11 is formed adjacent to the transistor M31 in the active region 406 such that it shares a common source/drain with the transistor M31. The gate of the transistor M11, represented by a dashed rectangle, is coupled by a contact to the sense node SN1. A contact to the rail VRT is for example formed in the active region 406 adjacent to the transistor M11 and is thus for example coupled to the drain of the transistor M11. The transistor M21 is for example formed adjacent to the VRT contact such that its drain is coupled to the VRT rail, and it shares a common source/drain with the transistor M11. The gate of the transistor M21, represented by a dashed rectangle, is coupled by a contact to the RST rail. A contact of the sense node SN1 is for example formed in the active region 406 adjacent to the transistor M21 and close to an end of the active region 406 in the pixel PIX #1, thereby coupling the source of the transistor M21 to the sense node SN1.

Similarly, in the pixel PIX #2, the transistor M32 is for example formed adjacent to the VX contact such that its source is coupled to the VX column line, and this source is a common source shared by the transistors M31 and M32 of the adjacent pixels. The gate of the transistor M32, represented by a dashed rectangle, is coupled by a contact to the READ rail in order to receive the signal READ2. The transistor M12 is formed adjacent to the transistor M32 in the active region 406 such that it shares a common source/drain with the transistor M32. The gate of the transistor M12, represented by a dashed rectangle, is coupled by a contact to the sense node SN2. A contact to the rail VRT is for example formed in the active region 406 adjacent to the transistor M12 and is thus for example coupled to the drain of the transistor M12. The transistor M22 is for example formed adjacent to the VRT contact such that its drain is coupled to the VRT rail, and it shares a common source/drain node with the transistor M12. The gate of the transistor M22, represented by a dashed rectangle, is coupled by a contact to the RST rail. A contact of the sense node SN2 is for example formed in the active region 406 adjacent to the transistor M22 and close to an end of the active region 406 in the pixel PIX #2, thereby coupling the source of the transistor M22 to the sense node SN2.

In view of the opening in the isolation trench between the pixels PIX #1, PIX #2, these pixels share a same bulk. Therefore, in some embodiments the bulk connections 212 of the pixels in FIG. 2 are replaced in FIG. 4 by a single bulk connection 412 in one of these pixels. In the example of FIG. 4, this bulk connection 412 is close to the top edge of the pixel PIX #1, although other locations would be possible.

Figure 5:
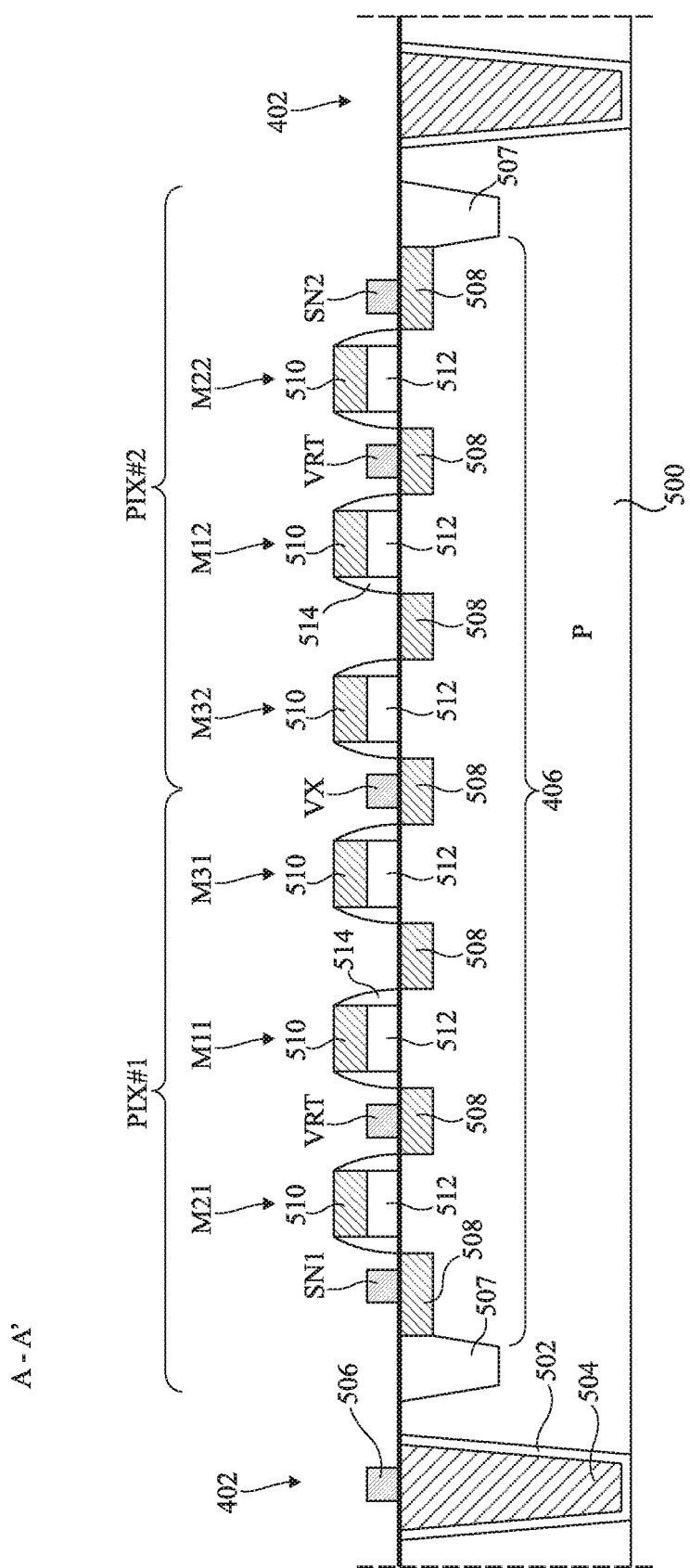
FIG. 5 is a cross-section view of the adjacent pixels of FIG. 4 according to an example embodiment.

FIG. 5 is a cross-section view of the pixels of FIG. 4 taken along a line A-A' running along the active region 406 according to an example embodiment.

In the example of FIG. 5, the device comprises a p-type substrate 500. For example, the substrate 500 is a lightly p-doped substrate. Alternatively, it could be an un-doped substrate and/or an epitaxial substrate. The isolation trench 402 is for example a full depth CDTI trench formed of a layer of insulator 502 lining the trench, and of a conductive core 504 formed, for example, of a metal or of polysilicon. In the example of FIG. 5, a CDTI trench contact 506 is formed on the left-hand portion represented in FIG. 5 of the isolation trench 402, permitting a voltage to be applied to the conductive core 504. Of course, such a contact could be positioned anywhere around the trench.

The active region 406 is for example a strip of p-type silicon delimited on all sides by an isolation trench. In the example of FIG. 5, the active region 406 is delimited by a shallow trench isolation 507, which is visible at each end of the active region 406 in the view of FIG. 5. However, in alternative embodiments, the active region could extend to the edge of the isolation trench 402, and the trench 507 could be omitted, at least on some sides of the active region 406.

The active region 406 also comprises doped n-type zones (N+) 508 at the surface of the active region 406 forming sources and drains of the transistors. These N+ zones 508 are for example present throughout the region 406, except below the gate stacks of the six transistors of the pixels PIX #1, PIX #2 that are formed in/on the active region 406. Indeed, the N+ zones 508 have for example been formed by implanting the active region 406 after the formation of the gates stacks, such that the sources and drains are automatically aligned with the gate stacks.

The six transistors are represented in FIG. 5. A gate stack of each transistor for example comprises a polysilicon gate conductor 510 formed over the insulating layer 512, which is in turn formed on the surface of the p-type substrate 500. The insulating layers 512 are for example formed of silicon oxide. In some embodiments, each gate stack comprises spacers 514 formed on each side thereof.

An advantage of the use of the common active region 406 as shown in FIGS. 4 and 5 is that the pixel dimensions can be reduced. This is due in part to the fact that a single VX contact is shared between two adjacent pixels. Furthermore, when two active regions are separated by one or more isolation trenches, such as STIs and/or DTIs, a relatively large spacing should generally be maintained between the edges of the active regions and each isolation trench. By removing the isolation trenches and joining the active regions to create the common active region 406, this spacing is thereby avoided.

It will be noted that the opening in the isolation trench between the pixels, and the common active region 406, could result in an increase in the photo-generated charge crossing from one photodiode to the other. However, this will be reduced by the relatively low impedance and high potential VRT nodes of each pixel formed in the active region 406.

Furthermore, it will be noted that, in the embodiment of FIGS. 4 and 5, the pixel PIX #2 is flipped such that it is a mirror image of the pixel PIX #1. The resulting inversion of the physical direction current between the source follower transistors M11, M12 and reset transistors M21, M22 could produce a mismatch in performance between the two pixels, but this will be largely compensated if double-sampling or correlated double-sampling is performed in the read-out chain (described in more detail below). Furthermore, in the case that the pixels PIX #1, PIX #2 having different color filters, such as if a Bayer pattern is used, any mismatch between their sensitivities will be largely compensated by a color matrixing operation that can be applied to the output images, as known by those skilled in the art.

FIGS. 4 and 5 illustrate one example of the form of the isolation trench 402 comprising a portion 404 extending partially along the boundary between the two adjacent pixels. This is merely one example. Alternative forms of the isolation trench 402 would be possible, as will now be described with reference to FIGS. 6 to 10.

FIGS. 6 to 10 are plan views illustrating the layout of two adjacent 4T pixels each corresponding to the pixel of FIG. 3. In each of these figures, the layouts are similar in many aspects to the layout of FIG. 4. Like reference numerals have been used for like features with respect to FIG. 4, and these features will not be described again. It will also be noted that some reference numerals are omitted in FIGS. 6 to 10 for ease of illustration. Only the differences of each embodiment with respect to FIG. 4 will be described in detail.

Figure 6:
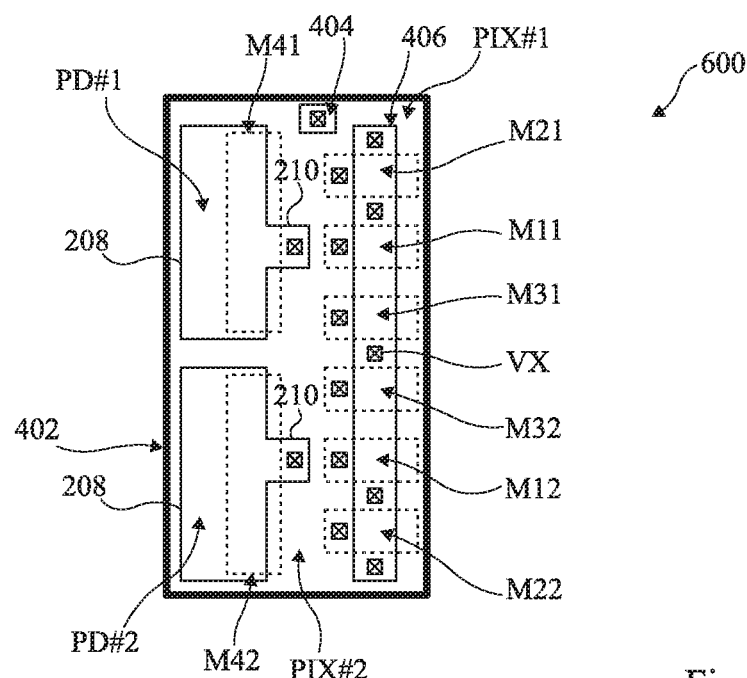
FIG. 6 is a plan view illustrating a layout of two adjacent 4T pixels each corresponding to the pixel of FIG. 3 according to a further example embodiment of the present disclosure.

In the embodiment of FIG. 6, the portion 404 of the isolation trench 402, extending partially along the boundary between the two pixels, is no longer present. This is likely to lead to increased cross-talk between the pixels PIX #1, PIX #2, but this may be acceptable for some applications.

Figure 7:
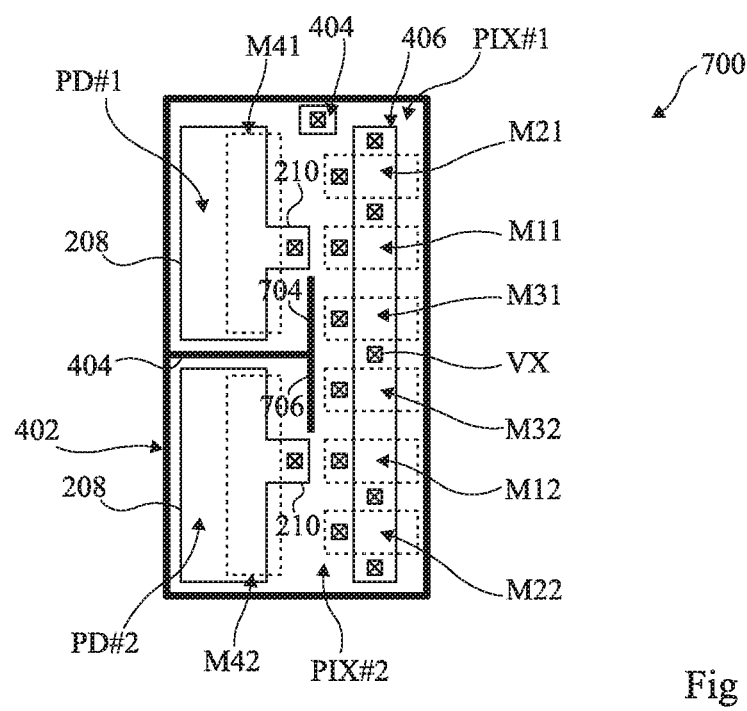
FIG. 7 is a plan view illustrating a layout of two adjacent 4T pixels each corresponding to the pixel of FIG. 3 according to a further example embodiment of the present disclosure.

In the embodiment of FIG. 7, the portion 404 of the isolation trench 402 is present, like in FIG. 4, and is extended by a portion 704 extending into the pixel PIX #1 between the photodiode PD #1 and the transistor M31, and by a portion 706 extending into the pixel PIX #2 between the photodiode PD #2 and the transistor M32. The portions 402, 704 and 706 for example thus form a "T" shape. The portion 704 for example stops short of the protrusion 210 of the photodiode PD #1, and similarly the portion 706 for example stops short of the protrusion 210 of the photodiode PD #2.

The advantage of providing the portions 704 and 706 is that they provide additional isolation between the photodiodes PD #1, PD #2, further reducing the risk of cross-talk.

Figure 8:
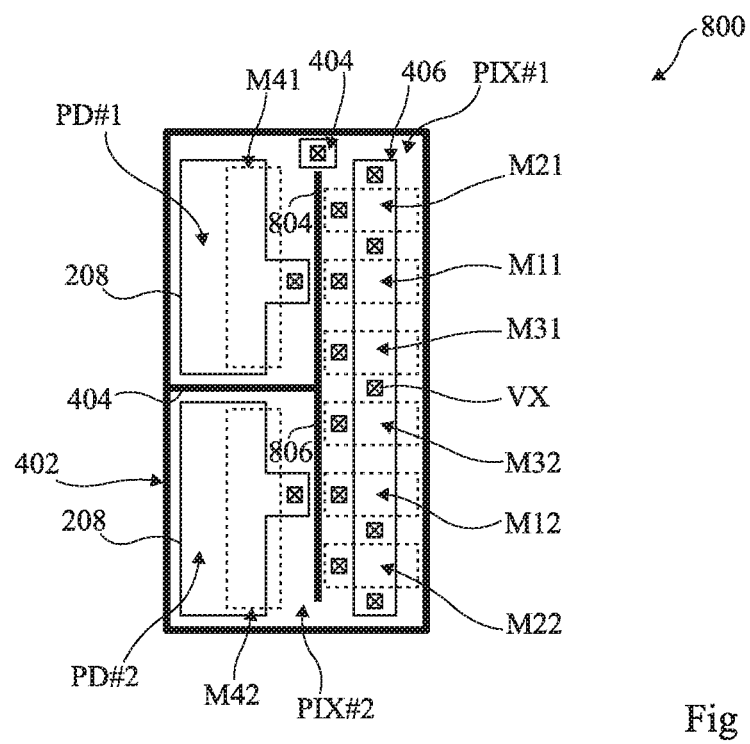
FIG. 8 is a plan view illustrating a layout of two adjacent 4T pixels each corresponding to the pixel of FIG. 3 according to yet a further example embodiment of the present disclosure.

The embodiment of FIG. 8 is similar to the embodiment of FIG. 7, except that the portions 704 and 706 are replaced by longer portions 804 and 806. The portion 804 for example extends between the photodiode PD #1 and the three transistors M31, M11 and M21, but an opening is maintained between an end of the portion 804 and the portion of the trench 402 that runs along the top of the pixel PIX #1. The bulk connection 404 is for example formed in this opening. Similarly, the portion 806 for example extends between the photodiode PD #2 and the three transistors M32, M12 and M22, but an opening is maintained between an end of the portion 806 and the portion of the trench 402 that runs along the bottom of the pixel PIX #2.

Figure 9:
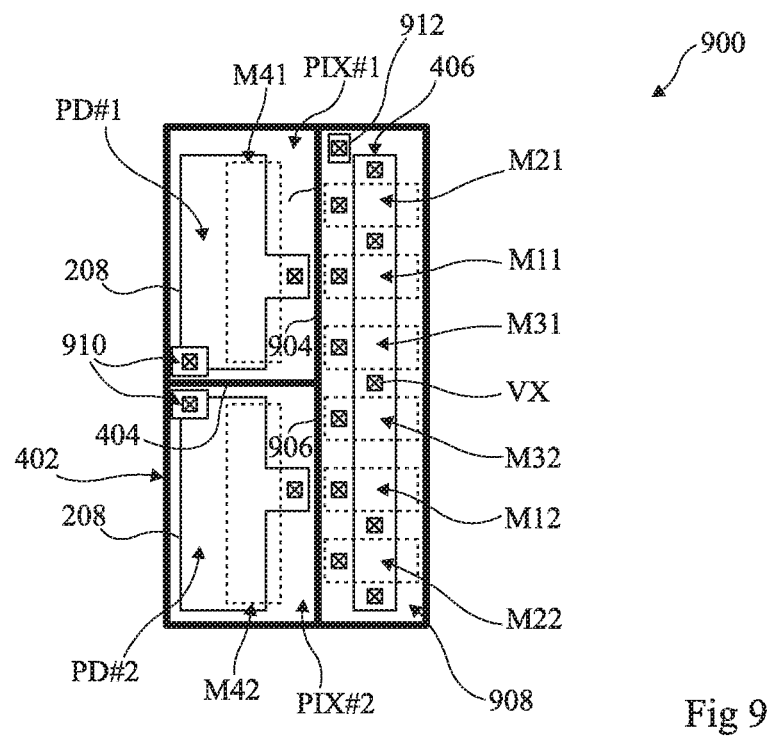
FIG. 9 is a plan view illustrating a layout of two adjacent 4T pixels each corresponding to the pixel of FIG. 3 according to yet a further example embodiment of the present disclosure.

The embodiment of FIG. 9 is similar to the embodiment of FIG. 8, except that the portions 804 and 806 are replaced by portions 904 and 906. The portion 904 for example extends all the way from the portion 404 to meet the portion of the trench 402 that runs along the top of the pixel PIX #1. Similarly, the portion 906 for example extends all the way from the portion 404 to meet the portion of the trench 402 that runs along the bottom of the pixel PIX #2. The layout is thus divided by the isolation trench 402 into three isolated regions, one containing each photodiode PD #1, PD #2, and the third forming a readout zone 908 comprising the active region 406 and the six transistors of the pixels PIX #1, PIX #2.

The bulks of the regions of FIG. 9 being divided by the isolation trenches, a bulk connection is for example formed in each region. For example, a bulk connection 910 is formed within the region of each photodiode PD #1, PD #2. In the example of FIG. 9, in order to avoid reducing the surface area of the photodiodes, the bulk connections 910 for example at least partially overlap the corresponding photodiodes. The pixels are for example backside illuminated (BSI), and thus such an overlap does not significantly reduce sensitivity. A bulk connection 912 is also for example formed in the readout zone 908.

Figure 10:
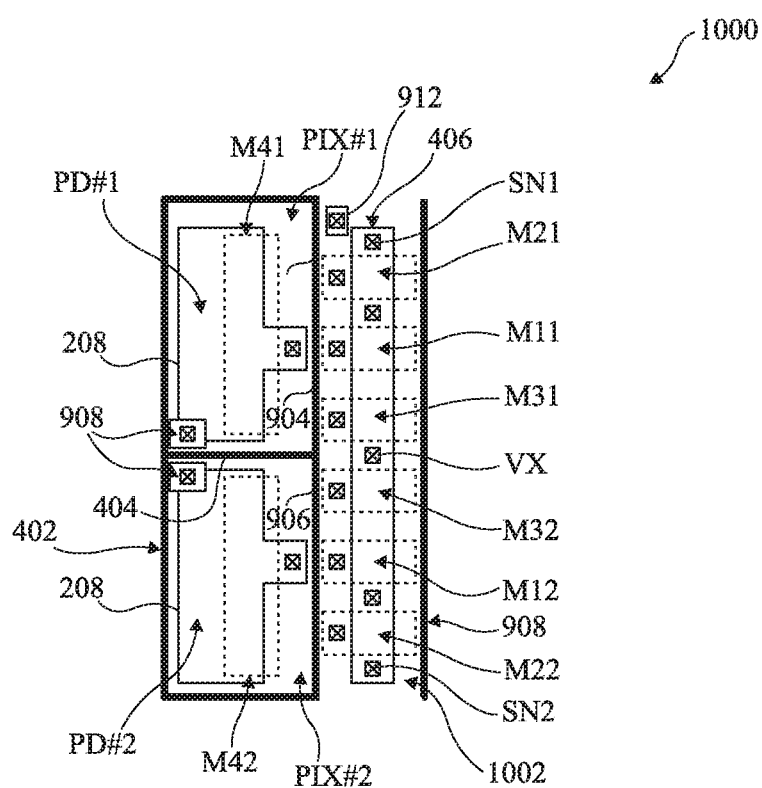
FIG. 10 is a plan view illustrating a layout of two adjacent 4T pixels each corresponding to the pixel of FIG. 3 according to yet a further example embodiment of the present disclosure.

The embodiment of FIG. 10 is similar to that of FIG. 9, except that, in the example of FIG. 10, the readout zone 908 is replaced by a readout zone 1002 that is open above and/or below, thereby providing a continuous bulk with respect to readout zones of one or more pixels above the pixel PIX #1 in the column and/or one or more pixels below the pixel PIX #2 in the column. The removal of the isolation trench separating the readout zones of adjacent pixels for example permits a reduction in the pixel size. However, in the embodiment of FIG. 10, the active region 406 is not shared with neighboring pixels. Indeed, the contacts at the ends of the active region 406 in FIGS. 4 to 10 are the storage node contacts SN1, SN2, which should not be made common between adjacent pixels.

Figure 11:
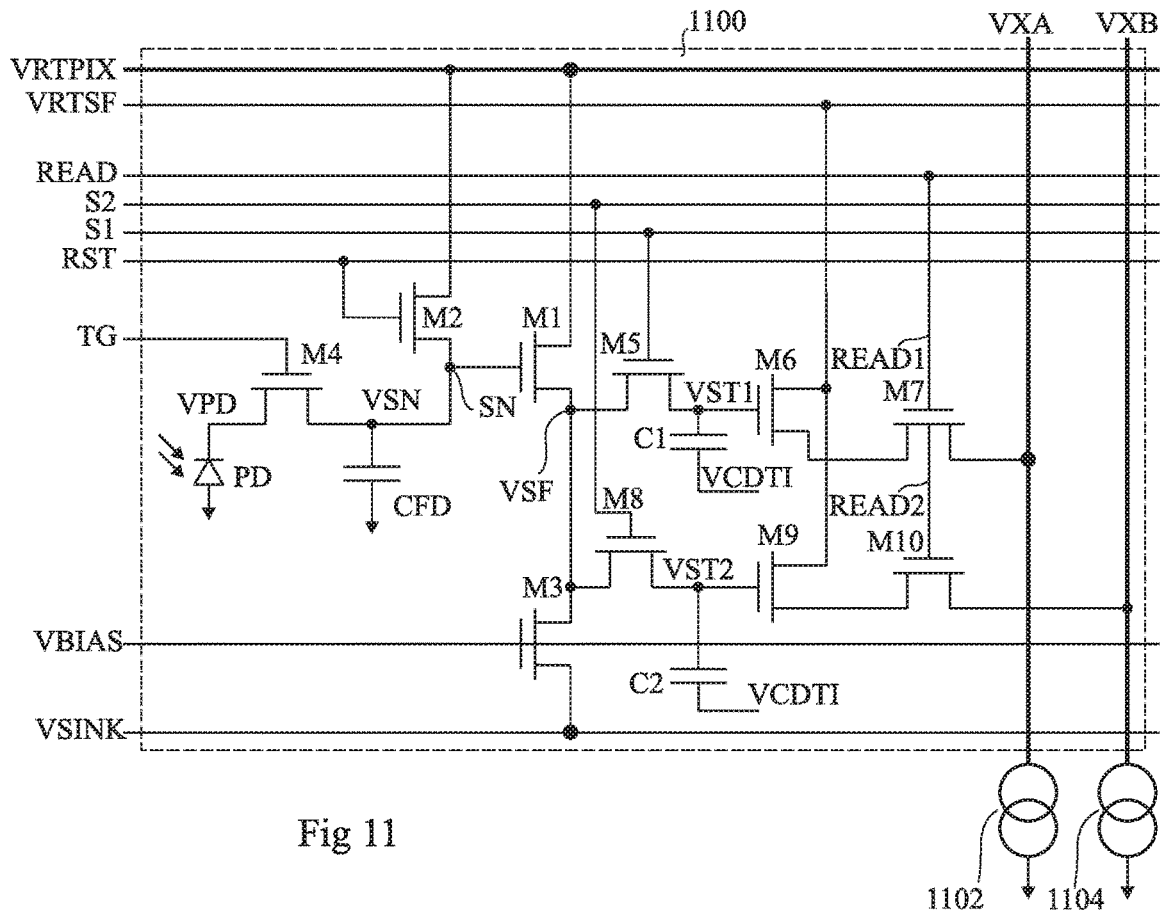
FIG. 11 schematically illustrates a voltage domain global shutter pixel according to an example embodiment.

FIG. 11 schematically illustrates a voltage domain global shutter pixel 1100 according to an example embodiment. Such a circuit is for example described in more detail in U.S. Pat. No. 10,021,334, the contents of which is hereby incorporated by reference to the extent permitted by the law.

The pixel 1100 for example comprises a photodiode PD, which is for example a buried, fully depleted, photodiode, having its anode coupled to a ground rail. The cathode of the photodiode PD provides a photodiode voltage VPD, and is for example coupled to a sense node SN via a transfer gate represented by a transistor M4 in FIG. 11. The gate of the transistor M4 is controlled by a signal TG. The sense node SN is coupled via a transistor M2 to a pixel reset voltage rail VRTPIX. The transistor M2 for example has its gate coupled to a rail for receiving a control signal RST. The sense node SN, which stores a voltage VSN on a capacitor CFD, is also for example coupled to the control node of a further transistor M1, which is arranged in a source-follower configuration. For example, the transistor M1 has its drain coupled to the rail VRTPIX, and its source coupled to a rail VSINK via a biasing transistor M3 of the pixel. The gate of the transistor M3 is controlled by a control signal VBIAS provided on a corresponding rail.

The source of the transistor M1 provides a common access node VSF via which the voltage VSN can be transferred to one of two internal storage nodes VST1, VST2 of the pixel. The storage node VST1 is for example used to store a photosignal generated by the photodiode PD, and the storage node VST2 is for example used to store a reference signal following reset of the sense node SN. Of course, the roles of the storage nodes VST1, VST2 could be reversed. Further uses for these storage nodes are for example described in U.S. Pat. No. 9,813,631.

The node VSF is for example coupled to the storage node VST1 via the main conducting nodes of a transistor M5. The storage node VST1 is coupled to a capacitor C1, which is for example formed of a CDTI, referenced to a voltage VCDT1. In alternative embodiments, different types of capacitors could be used. The storage node VST1 is also coupled to the gate of a transistor M6 coupled in a source follower configuration. For example, a drain of the transistor M6 is coupled to a supply rail VRTSF, and the source of the transistor M6 is coupled to a pixel column line VXA via the main conducting nodes of a further transistor M7. The column line VXA is for example coupled, at the bottom of the column, to a current source 1102, which biases the source follower transistor M6 during a read operation. The transistor M5 is for example controlled at its gate by a signal S1 provided on a corresponding rail, and the transistor M7 is for example controlled at its gate by a read signal READ1 provided on a rail READ.

The node VSF is also coupled to the storage node VST2 via the main conducting nodes of a transistor M8. The storage node VST2 is coupled to a capacitor C2, which is for example formed of a CDTI, referenced to a voltage VCDT1. In alternative embodiments, different types of capacitors could be used. The storage node VST2 is also coupled to the gate of a transistor M9 coupled in a source follower configuration. For example, a drain of the transistor M9 is coupled to a supply rail VRTSF, and the source of the transistor M9 is coupled to a pixel column line VXB via the main conducting nodes of a further transistor M10. The column line VXB is for example coupled, at the bottom of the column, to a current source 1104, which biases the source follower transistor M9 during a read operation. The transistor M8 is for example controlled at its gate by a signal S2 provided on a corresponding rail, and the transistor M10 is for example controlled at its gate by the read signal READ2 provided on the rail READ.

The rails VRTPIX, VRTSF, READ, S2, S1, RST, TG, VBIAS and VSINK, as well as the ground rail (not illustrated), are for example common to a row of pixels in the pixel array. The pixel column lines VXA, VXB are for example common to a column of pixels in the pixel array.

Figure 12:
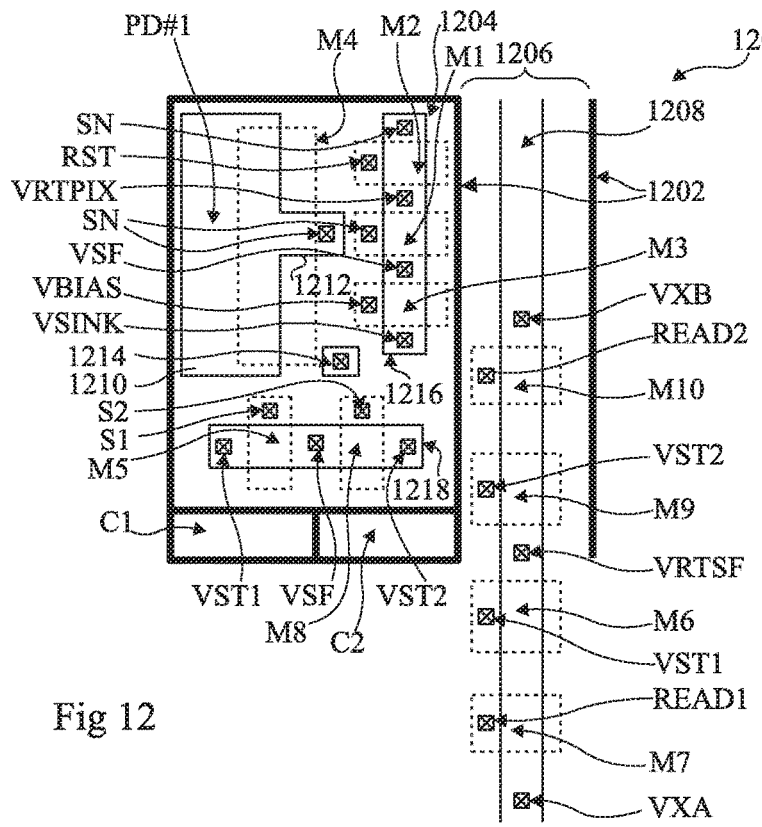
FIG. 12 is a plan view illustrating a layout of the pixel of FIG. 11 according to an example embodiment of the present disclosure.

FIG. 12 is a plan view illustrating a layout 1200 of the pixel 1100 of FIG. 11 according to an example embodiment of the present disclosure.

The layout 1200 for example comprises isolation trenches 1202, which are for example DTIs or CDTIs. The trenches 1202 for example delimit a photodiode region 1204 and two regions respectively containing the capacitors C1 and C2 of the pixel 1100. Like in the embodiment of FIG. 10, a readout zone 1206 is for example open at the top and/or bottom of the pixel such that a common active region 1208 may be shared with one or more adjacent pixels of the column.

The photodiode PD #1 of the pixel of FIG. 12 is positioned on the left-hand side of the region 1204, and comprises an active region 1210. The active region 1210 is for example substantially rectangular, with a protrusion 1212 on the right-hand side in which is formed a contact with the node SN. The transfer gate M4 of the pixel 1100 is represented by a dashed rectangle, and partially overlaps the active region 1210, including a part of the protrusion 1212 of the photodiode PD #1, excluding the contact SN.

A bulk connection 1214 is for example provided in the region 1204, allowing a voltage to be applied to a substrate (not illustrated in FIG. 12) of the region 1204. In one example, the transistors of the pixel 1100 are n-channel MOS transistors, and the substrate is of p-type.

The region 1204 also comprises a continuous active region 1216 within and on which are formed the transistors M1, M2 and M3. This active region 1216 for example comprises, from top to bottom in the example of FIG. 12: a contact for the sense node SN; the transistor M2, a gate of the transistor M2 being represented by a dashed rectangle crossing the active region 1216 and including a gate contact coupled to the rail RST; a contact connected to the rail VRTPIX; the transistor M1 having a gate represented by a dashed rectangle crossing the active region 1216 and including a gate contact coupled to the sense node SN; a contact connected to the node VSF; the transistor M3 having a gate represented by dashed rectangle crossing the active region 1216 and including a gate contact coupled to the rail VBIAS; and a contact coupled to the voltage rail VSINK.

The region 1204 further comprises a continuous active region 1218 within and on which are formed the transistors M5 and M8. This active region 1218 for example comprises, from left to right in the example of FIG. 12: a contact for the storage node VST1; the transistor M5, having a gate represented by a dashed rectangle crossing the active region 1218 and including a gate contact coupled to the rail S1; a contact coupled to the node VSF; the transistor M8 having a gate represented by a dashed rectangle crossing the active region 1218 and including a gate contact coupled to the rail S2; and a contact coupled to the storage node VST2.

The transistors M10, M9, M6 and M7 are for example formed within and on the active region 1208. This active region 1208 for example comprises, from top to bottom in the example of FIG. 12:

- a contact to the pixel column line VXB;
- the transistor M10, having a gate represented by a dashed rectangle crossing the active region 1208 and including a gate contact coupled to the rail READ for receiving the read signal READ2;
- the transistor M9 sharing a common source/drain region with the transistor M10 and having a gate represented by a dashed rectangle crossing the active region 1208 and including a gate contact coupled to the storage node VST2;
- a contact connected to the VRTSF rail;
- the transistor M6 having a gate represented by a dashed rectangle crossing the active region 1208 and including a gate contact coupled to the storage node VST1;
- the transistor M7 sharing a common source/drain with the transistor M6 and having a gate represented by a dashed rectangle crossing the active region 1208 and including a gate contact coupled to the rail READ for receiving the read signal READ1; and
- a contact coupled to the pixel column line VXA.

It will be noted that in FIG. 12 the contacts of the pixel 1100 formed at the top and bottom of the active region 1208 within the pixel are VXB and VXA contacts, which can be shared with adjacent pixels, as will now be described in more detail with reference to FIGS. 13 to 17.

Figure 13:
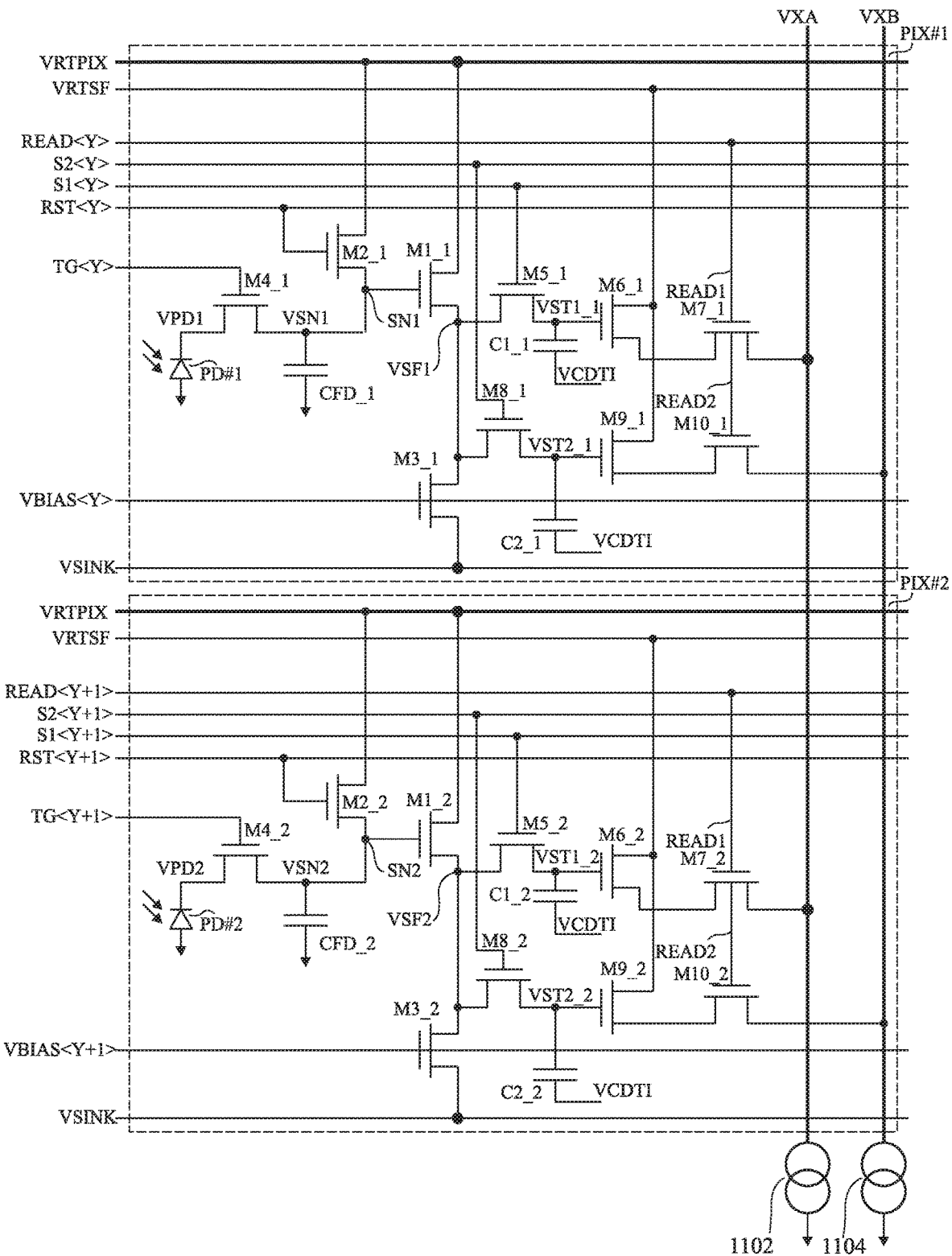
FIG. 13 schematically illustrates two adjacent voltage domain global shutter pixels according to an example embodiment of the present disclosure.

FIG. 13 schematically illustrates two adjacent voltage domain global shutter pixels PIX #1, PIX #2 according to an example embodiment of the present disclosure.

The pixel PIX #1 of FIG. 13 is the same as the pixel 1100 of FIGS. 11 and 12. The transistors and nodes of this pixel are labelled with the suffix "1" or "_1" with respect to references in FIGS. 11 and 12 to indicate that they belong to the pixel PIX #1 in FIG. 13.

The pixel PIX #2 of FIG. 13 is almost the same as the pixel 1100 of FIGS. 11 and 12. The transistors and nodes of this pixel are labelled with the suffix "2" or "_2" with respect to references in FIGS. 11 and 12 to indicate that they belong to the pixel PIX #2 in FIG. 13. With respect to the pixel 1100, the pixel PIX #2 of FIG. 13 has its transistor M7_2 coupled to the pixel column line VXB rather than to the pixel column line VXA, and its transistor M10_2 coupled to the pixel column line VXA rather than to the pixel column line VXB. This is for example repeated along the whole column of pixels, with alternate pixels having the configuration of the pixel PIX #1, and the other pixels having the configuration of the pixel PIX #2. In this way, the order of the transistors along the active region 1208 of FIG. 12 can be the same for each pixel, reducing pixel mismatch and in particular PRNU (photo-response non-uniformity) noise.

Figure 14:
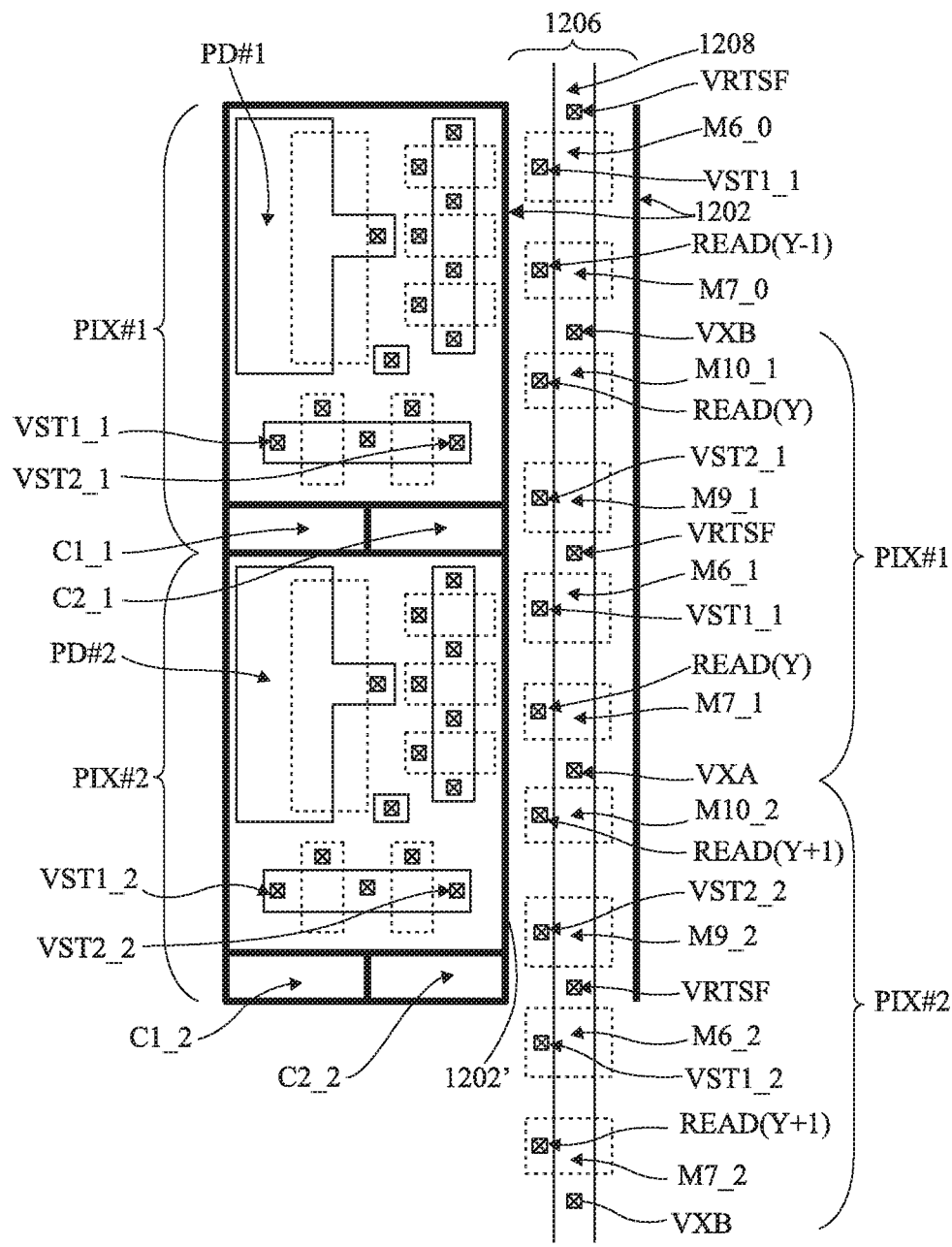
FIG. 14 is a plan view illustrating a layout of the two adjacent pixels of FIG. 13 according to an example embodiment of the present disclosure.

FIG. 14 is a plan view illustrating a layout of the two adjacent pixels PIX #1, PIX #2 of FIG. 13 according to an example embodiment of the present disclosure. This layout corresponds to the layout of FIG. 12, repeated for the two pixels of FIG. 13. The isolation trench of the pixels PIX #2 is labelled 1202'. It can be seen that a continuous strip of active region 1208 is used to implement the transistors M6, M7, M9 and M10 of both of the pixels PIX #1 and PIX #2.

With reference again to FIG. 13, the switching of the connections to the output column lines VXA, VXB can for example be corrected in a number of different manners.

In one embodiment, the signals S1 and S2 could be swapped on alternate rows. In other words, for rows of pixels in which the transistor M7 is coupled to the column line VXB, the signal S1 received by the transistor M5 could be replaced by the signal S2, either by coupling the gate of the transistor M5 to the rail S2, or by applying to the rail S1 of this row the signal S2. Similarly, in these rows, the signal S2 received by the transistor M8 could be replaced by the signal S1, either by coupling the gate of the transistor M8 to the rail S1, or by applying to the rail S2 of this row the signal S1.

An alternative solution is to swap the output signals of alternate rows, as will now be described in more detail with reference to FIG. 15.

Figure 15:
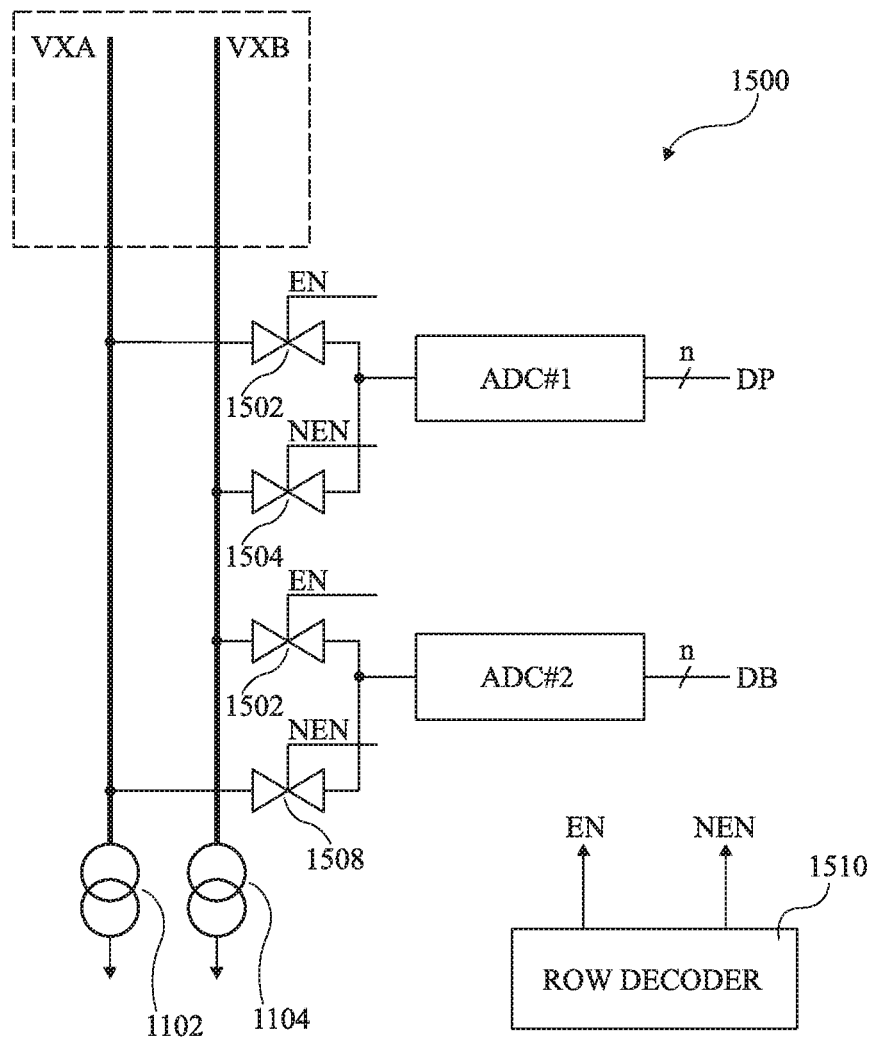
FIG. 15 schematically illustrates a column output circuit of an image sensor according to an example embodiment of the present disclosure.

FIG. 15 schematically illustrates a column output circuit 1500 of an image sensor according to an example embodiment of the present disclosure. The circuit 1500 is for example positioned at the bottom of each column of an image sensor comprising the pixels of FIG. 13.

The pixel column line VXA is for example coupled via a transmission gate 1502 to the input of an analog to digital converter ADC #1, which provides an n-bit output value DP. The pixel column line VXB is for example coupled via a transmission gate 1504 to the input of the analog to digital converter ADC #1.

The pixel column line VXA is also for example coupled via a transmission gate 1506 to the input of an analog to digital converter ADC #2, which provides an n-bit output value DB. The pixel column line VXB is for example coupled via a transmission gate 1508 to the input of the analog to digital converter ADC #2.

The signal DP for example corresponds to the photosignal read from a pixel, and the signal DB for example corresponds to the reference signal, or black reference data, read from a pixel.

The transmission gates 1502 and 1506 are for example activated by an enable signal EN, while the transmission gates 1504 and 1508 are for example activated by the inverse NEN of the enable signal EN. The enable signal EN is inverted for alternate rows during the read operation of the pixel array. For example, the enable signal corresponds to the least significant bit of the Y (row) address during the read operation generated by a row decoder (ROW DECODER) 1510.

For example, when even rows of the pixel array are being read, the pixel column line VXA provides the photosignal and is coupled to the converter ADC #1, and the pixel column line VXB provides the reference signal and is coupled to the converter ADC #2. Image processing performed on the n-bit output signals DP and DB then for example involves calculating DP-DB, corresponding to the signal read via VXA minus the signal read via VXB.

When odd rows of the pixel array are being read, the pixel column line VXB provides the photosignal and is coupled to the converter ADC #1, and the pixel column line VXA provides the reference signal and is coupled to the converter ADC #2. Image processing performed on the n-bit output signals DP and DB then for example involves again calculating DP-DB, which this time corresponds to the signal read via VXB minus the signal read via VXA.

Figure 16:
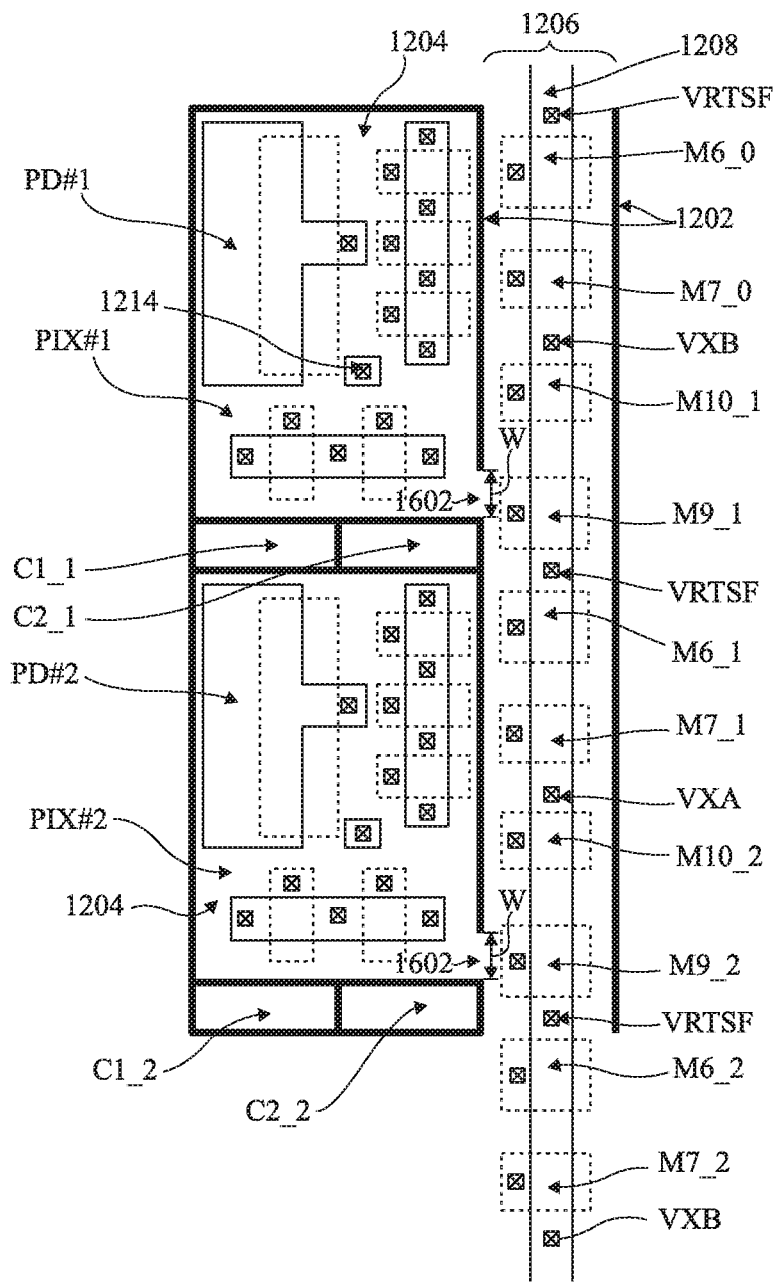
FIG. 16 is a plan view illustrating a layout of the two adjacent pixels of FIG. 13 according to an alternative embodiment to that of FIG. 14.

FIG. 16 is a plan view illustrating a layout of the two adjacent pixels of FIG. 13 according to an alternative embodiment to that of FIG. 14. The layout of FIG. 16 is the same as that of FIG. 14, except that, in the embodiment of FIG. 16, the isolation trenches 1202, 1202' surrounding each pixel region 1204 of each pixel PIX #1, PIX #2 include an opening 1602 on the side of the readout zone 1206. This opening for example has a width w of between 100 and 750 nm.

The readout zone 1206 in the example of FIG. 14 for example comprises a bulk connection (not illustrated in FIG. 14) such that a voltage can be applied to the substrate of the transistors formed in this zone. Such a bulk connection can be omitted in the embodiment of FIG. 16 in view of the openings 1602, which permit the bulk connections 1214 in the photodiode regions 1204 to serve both the regions 1204 and the readout zone 1206.

Figure 17:
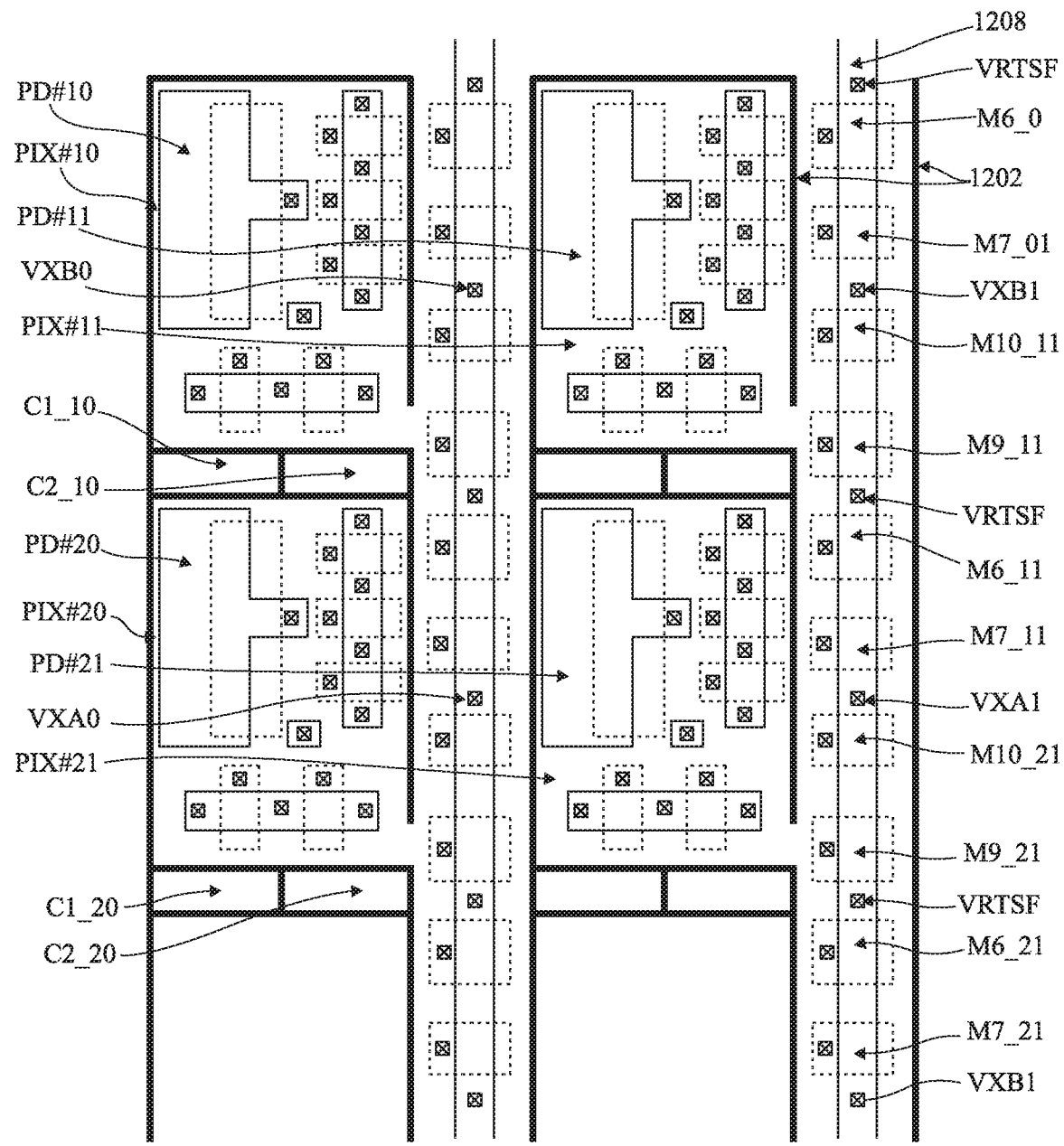
FIG. 17 is a plan view illustrating a layout of six adjacent pixels corresponding to the pixels of FIG. 13 according to an example embodiment of the present disclosure.

FIG. 17 is a plan view illustrating a layout of six adjacent pixels according to the layout of FIG. 16. In particular, whereas FIG. 16 illustrates a single column of pixels, FIG. 17 illustrates that this column can be repeated to create a pixel array of two or more columns and two or more rows. In FIG. 17, the references have been modified to use the suffix "10" for the pixel in a row 1 and column 0 of the array, the suffix "20" for the pixel in a row 2 and column 0 of the array, the suffix "11" for the pixel in a row 1 and column 1 of the array, and the suffix "21" for the pixel in a row 2 and column 1 of the array.

Figure 18:
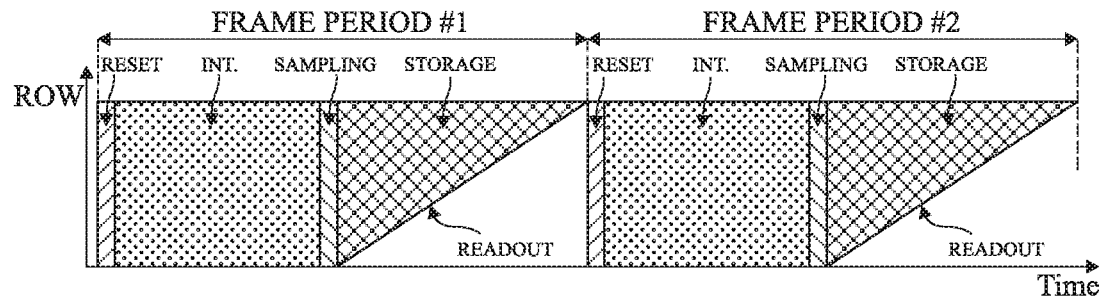
FIG. 18 is a timing diagram representing phases of operation of an image sensor formed of global shutter pixels according to an example embodiment.

FIG. 18 is a timing diagram representing phases of operation of an image sensor formed of global shutter pixels according to an example embodiment. The timing represented in this figure for example applies to the pixels of FIGS. 11 to 17, and could equally apply to the pixels of FIGS. 3 to 10 in the case that these pixels are operated as global shutter rather than rolling blade pixels.

In the timing diagram of FIG. 18, the rows of the pixel array are represented on the y-axis. Two frame periods (FRAME PERIOD #1, FRAME PERIOD #2) are represented in FIG. 18. During each frame period, there is an initial reset period (RESET) during which the voltages at the sense and/or storage nodes of the pixels are reset by asserting the reset signal RST. Then, during a global integration period (INT.), charge is photo-generated by the photodiodes of the pixel array. During a subsequent sampling period (SAMPLING), the reference and photosignal voltages are stored within each pixel. Then, during a readout phase (READOUT), the storage voltages (STORAGE) are read out row by row, until the reference and photosignal voltages have been read from all of the pixels of all of the rows of the array.

Figure 19:
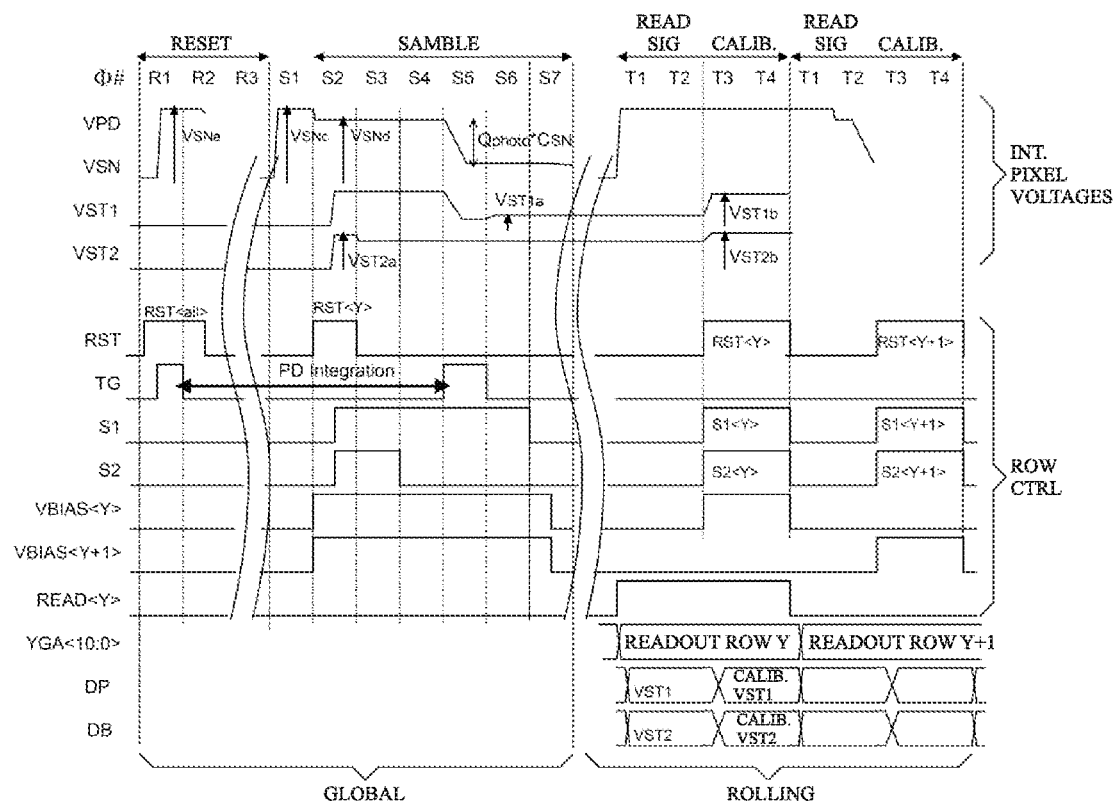
FIG. 19 is a timing diagram representing signals during operation of an image sensor formed of the global shutter pixels of FIG. 13 according to an example embodiment.

FIG. 19 is a timing diagram representing a single frame period of FIG. 18 in more detail, for the specific case of the pixels of FIGS. 11 to 17.

FIG. 19 represents in particular the internal pixel voltages (INT. PIXEL VOLTAGES) VPD, VSN, VST1 and VST2, the row control signals (ROW CTRL) RST, TG, S1, S2, VBIAS<Y> of a row Y, VBIAS<Y+1> of a row Y+1, and READ<Y> of the row Y, digital control signals YGA<10:0> indicating the address of the row to be activated, where 11 bits in this example implies 2048 rows, and output signals DP and DB.

A reset phase (RESET) and sample phase (SAMPLE) are for example global operations (GLOBAL) performed in parallel on all of the pixels of the array, and read and calibration phases (READ SIG., CALIB) are for example rolling operations (ROLLING) performed row by row.

The reset phase (RESET) for example comprises two sub-phases (□#) R1 and R2 timed by an appropriate counter. During the sub-phase R1, the signal RST is asserted, followed by the signal TG, such that the voltage VSN is reset to a level VSNa. The signal TG then goes low at the start of the phase R2, starting the integration period PD INT. of the pixels, and the signal RST then goes low.

The sampling phase occurs near the end of the integration period, and for example involves sub-phases s1 to s7. During the sub-phase s1, the voltage VSN rises to a level VSNc, which is close to the level of VSNa, with a variation caused for example by the falling edges of the signals RST and TG. At the start of the sub-phase s2, the signals VBIAS and RST are asserted, activating the source follower transistor M2 of each pixel, and causing the signal VSN to fall slightly to level VSNd. The signals S1 and S2 are also asserted during the sub-phase s2, and the signals VST1 and VST2 rise. This stores the reset voltage, including kTC noise from the sense nodes, to C1 and C2. At the start of the sub-phase s3, the reset signal RST is brought low, causing a slight change in the signal VST2 due to kTC noise at the sense node. At the start of the sub-phase s4, the signal S2 is brought low, such that the capacitor C2 stores the reset level. Thus the voltage VST1 falls based on the new level of the voltage VSN. At the start of the sub-phase s5, the signal TG is asserted. The signal VSN thus falls by a voltage drop dependent on the product of the photo-generated charge Qphoto accumulated during the integration period and the capacitance CSN at the sense node SN. The signal TG is brought low again at the start of the sub-phase s6, causing a slight rise of the voltage VST1 to a level VST1a. At the start of the sub-phase s7, the signal S2 goes low, and then the signals VBIAS<Y> and VBIAS<Y+1> also go low.

The read and calibration phases of the row Y for example involve sub-phases T1 to T4. During the sub-phases T1 and T2, the signal READ<Y> is asserted. The signal DP is the digital conversion of the pixel signal VST1, and the signal DB is the digital conversion of the reference signal VST2. At the start of the sub-phase T3, the signals S1, S2 and RST are asserted for row Y, resetting the voltages VST1 and VST2 to the respective levels VST1b and VST2b, permitting calibration levels (CALIB. VT1, CALIB VT2) of the voltages VST1, VST2 to be read. These phases T1 to T4 are then repeated for the row Y+1, and until all rows have been read.

An example of the voltage VSN during the read and calibration phases is also shown in FIG. 19 as an example.

An advantage of the embodiments described herein is that, by providing a common active region shared by two or more adjacent pixels, the pixel size can be at least partially reduced in at least one dimension.

Various embodiments and variants have been described. Those skilled in the art will understand that certain features of these embodiments can be combined and other variants will readily occur to those skilled in the art. For example, while embodiments have been described in which the pixels are formed of NMOS transistors formed in a p-type substrate, it will be apparent to those skilled in the art that the principles could equally by applied to other transistor types or technologies.

Furthermore, it will be apparent to those skilled in the art that, while several specific pixel architectures have been described, these are merely examples, and the principles described herein could be applied to many other pixel architectures, including to a pixel similar to the one of FIG. 11, but with a single readout path.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An image sensor, comprising:
   a substrate;
   a first active region in the substrate, wherein the first active region is a strip of continuous semiconductor material;
   a first pixel that includes:
      a first transistor in the first active region;
      a second transistor in the first active region; and
   a second pixel that includes:
      a third transistor in the first active region, wherein the second transistor and the third transistor share a common source/drain terminal in the first active region; and
      a fourth transistor in the first active region;
   a first isolation trench having a first depth, wherein the first isolation trench delimits the first active region on all sides; and
   a second isolation trench separate from the first isolation trench and having a second depth greater than the first depth and surrounding the first pixel, the second pixel, and the first isolation trench.

2. The image sensor of claim 1, wherein the first active region is a strip of continuous semiconductor material surrounded by the first isolation trench.

3. The image sensor of claim 2, wherein the first pixel includes a first photodiode and the second pixel includes a second photodiode.

4. The image sensor of claim 3, wherein the first and second photodiodes are at least partially separated from each other by the second isolation trench.

5. The image sensor of claim 4, further comprising a third isolation trench extending between the first photodiode and the first active region and a fourth isolation trench extending between the second photodiode and the first active region.

6. An image sensor comprising:
   first and second pixels, one or more transistors of the first pixel share an active region with one or more transistors of the second pixel, the active region is a strip of continuous semiconductor material surrounded by a first isolation trench wherein the first pixel includes a first photodiode and the second pixel includes a second photodiode wherein the first and second photodiodes are at least partially separated from each other by a second isolation trench, the second isolation trench has a greater depth than the first isolation trench.

7. The image sensor of claim 6, wherein the one or more transistors of the first pixel include a source follower transistor having a control node coupled to the first photodiode and the one or more transistors of the second pixel include a source follower transistor having a control node coupled to the second photodiode.

8. The image sensor of claim 6, wherein a first transistor of the one or more transistors of the first pixel shares a common source or drain in the active region with a first transistor of the one or more transistors of the second pixel, the common source or drain being connected to a column line of the image sensor.

9. The image sensor of claim 8, wherein the first transistor of the first pixel is coupled between a source of a second transistor of the first pixel and the column line, and the first transistor of the second pixel is coupled between a source of a second transistor of the second pixel and the column line.

10. The image sensor of claim 9, wherein the first pixel comprises two readout paths, one of which includes the first and second transistors of the first pixel, and
   wherein the second pixel includes two readout paths, one of which includes the first and second transistors of the second pixel.

11. The image sensor of claim 6, wherein the one or more transistors of the first pixel and the one or more transistors of the second pixel are n-channel MOS transistors, and the active region is of type p with regions of type n forming sources and drains of the one or more transistors of the first pixel and the one or more transistors of the second pixel.

12. A device, comprising:
   a substrate;
   a first pixel having a first photodiode on a first active region in the substrate and a first plurality of transistors each in and on a second active region in the substrate, the first pixel having a first dimension along a first direction; and
   a second pixel having a second photodiode on a third active region in the substrate and a second plurality of transistors in and on the second active region, the second active region extending continuously from the first pixel to the second pixel;
   a first isolation trench in the substrate adjacent to the first and second pixels and having a first depth in the substrate; and
   a second isolation trench delimiting the second active region on all sides and having a second depth in the substrate less than the first depth, the first isolation trench surrounding the first active region, the second active region, and the first second isolation trench.

13. The device of claim 12, comprising a first trench insulation, a first portion of the first trench insulation positioned between the first active region and the third active region.

14. The device of claim 13, wherein the first trench insulation includes a dielectric liner layer and a conductive core inside the dielectric liner layer.

15. The device of claim 13, wherein the first trench insulation includes a second portion that is positioned between the second active region and one of the first active region or the third active region.

16. The device of claim 13, wherein the first trench insulation fully surrounds each of the first active region and the third active region in a lateral plane.

17. The device of claim 13, wherein the first trench insulation fully delimits an outer perimeter of the first pixel and the second pixel together.

18. The device of claim 12, wherein the first pixel and the second pixel share a bulk connection positioned on one of the first pixel or the second pixel.

19. An image sensor pixel, comprising:
- a substrate;
- a first trench insulation in a surface of the substrate, the first trench insulation substantially delimiting a first photodiode region that includes a first active region under a first photodiode and delimiting a second photodiode region that includes a second active region under a second photodiode;
- a readout region outside the first and second photodiode region and within the first trench insulation, the readout region having a third active region that extends from the first photodiode region in a first lateral direction beyond a perimeter of the first photodiode region to the second photodiode region; and
- a second trench insulation that delimits the third active region on all sides and is separate from the first trench insulation, the first trench insulation being deeper than the second trench insulation and surrounding the first active region, the second active region, the third active region, and the second trench insulation.

20. The device of claim 12, wherein the first trench insulation also delimits a capacitor region adjacent to the first photodiode region.

* * * * *

UNITED STATES PATENT AND TRADEMARK OFFICE
CERTIFICATE OF CORRECTION

PATENT NO. : 12,224,302 B2
APPLICATION NO. : 16/862316
DATED : February 11, 2025
INVENTOR(S) : Jeffrey M. Raynor et al.

Page 1 of 1

It is certified that error appears in the above-identified patent and that said Letters Patent is hereby corrected as shown below:

In the Claims

Column 16, Claim 12, Line 53:
"and the first second isolation" should read: --and the second isolation--.

Signed and Sealed this
Eighth Day of April, 2025

Coke Morgan Stewart
*Acting Director of the United States Patent and Trademark Office*